(12) United States Patent
Koike et al.

(10) Patent No.: US 8,665,657 B2
(45) Date of Patent: Mar. 4, 2014

(54) SEMICONDUCTOR MEMORY DEVICE

(71) Applicant: Panasonic Corporation, Osaka (JP)

(72) Inventors: Tsuyoshi Koike, Shiga (JP); Youji Nakai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/628,574

(22) Filed: Sep. 27, 2012

(65) Prior Publication Data

US 2013/0028032 A1 Jan. 31, 2013

Related U.S. Application Data

(63) Continuation of application No. PCT/JP2011/002388, filed on Apr. 22, 2011.

(30) Foreign Application Priority Data

May 17, 2010 (JP) ................................. 2010-113494

(51) Int. Cl.
*G11C 7/22* (2006.01)
*G11C 7/00* (2006.01)

(52) U.S. Cl.
USPC .................. 365/189.16; 365/189.05; 365/190

(58) Field of Classification Search
USPC .................................................. 365/189.16
See application file for complete search history.

(56) References Cited

U.S. PATENT DOCUMENTS

| | | | |
|---|---|---|---|
| 5,387,827 A | 2/1995 | Yokoyama et al. | |
| 6,091,629 A | 7/2000 | Osada et al. | |
| 6,172,918 B1 | 1/2001 | Hidaka | |
| 7,463,537 B2 * | 12/2008 | Chan et al. | 365/190 |
| 7,480,189 B2 | 1/2009 | Clark et al. | |

(Continued)

FOREIGN PATENT DOCUMENTS

| | | |
|---|---|---|
| JP | 03-216892 A | 9/1991 |
| JP | 10-106269 A | 4/1998 |
| JP | 2000-173269 A | 6/2000 |
| JP | 2005-166098 A | 6/2005 |

OTHER PUBLICATIONS

A. Kawasumi et al., "A Single-Power-Supply 0.7V 1GHz 45nm SRAM with an Asymmetrical Unit-β-ratio Memory Cell," ISSCC 2008 / Session 21 / SRAM/21.4.

(Continued)

*Primary Examiner* — Son Mai
(74) *Attorney, Agent, or Firm* — McDermott Will & Emery LLP (57) ABSTRACT

A first write transistor has a source connected to a power-supply node, a drain connected to a first local bit line, and a gate connected to a second write global bit line. A second write transistor has a source connected to the power-supply node, a drain connected to a second local bit line, and a gate connected to a first write global bit line. A third write transistor has a source connected to the first write global bit line, a drain connected to the first local bit line, and a gate receiving a first control signal. A fourth write transistor has a source connected to the second write global bit line, a drain connected to the second local bit line, and a gate receiving the first control signal. A read circuit is connected to the first and second local bit lines and first and second read global bit lines.

13 Claims, 7 Drawing Sheets

(56) References Cited

U.S. PATENT DOCUMENTS

| | | | |
|---|---|---|---|
| 8,139,432 B2 * | 3/2012 | Choi et al. | 365/211 |
| 2002/0031007 A1 | 3/2002 | Osada et al. | |
| 2005/0125591 A1 | 6/2005 | Fujimoto | |

OTHER PUBLICATIONS

International Search Report issued in International Patent Application No. PCT/JP2011/002388 dated Jul. 26, 2011.

* cited by examiner

SEMICONDUCTOR MEMORY DEVICE

CROSS-REFERENCE TO RELATED APPLICATION

This is a continuation of PCT International Application PCT/JP2011/002388 filed on Apr. 22, 2011, which claims priority to Japanese Patent Application No. 2010-113494 filed on May 17, 2010. The disclosures of these applications including the specifications, the drawings, and the claims are hereby incorporated by reference in their entirety.

BACKGROUND

The present disclosure relates to a semiconductor memory device, and more particularly to a semiconductor memory device having bit lines hierarchized through transistors.

Memories included in recent systems on chip (SOCs) tend to become larger in capacity and higher in speed. With a larger memory capacity, the number of memory cells connected to a bit line is increasing. This increases the load capacitance of the bit line, and thus hinders achievement of higher speed. To decrease the bit-line load capacitance, a hierarchical bit line technique is known where a bit line is divided into a plurality of banks, memory cells in each bank are connected to a local bit line, and the local bit line is connected to a global bit line through a transistor (see U.S. Pat. No. 7,480,189 (Patent Document 1), for example).

In a semiconductor memory device of Patent Document 1, as shown in FIG. 3 of this document, bit lines are hierarchically constituted by a pair of first and second local bit lines to which a plurality of memory cells are connected and a pair of first and second global bit lines for transferring input/output data to/from the first and second local bit lines.

Sense amplifiers are connected to the first and second global bit lines for execution of read and write operations. The first local bit line and the first global bit line are connected to each other through a first transfer transistor, and the second local bit line and the second global bit line are connected to each other through a second transfer transistor.

The semiconductor memory device of Patent Document 1 further includes first and second write transistors. The first write transistor has a source to which a write control signal is supplied, a drain connected to the first local bit line, and a gate connected to the second global bit line. The second write transistor has a source to which the write control signal is supplied, a drain connected to the second local bit line, and a gate connected to the first global bit line.

[Write Operation]

The write operation of the semiconductor memory device of Patent Document 1 will be described. In the write operation, write data is passed to the first and second global bit lines through the sense amplifiers. This changes the voltage level of either the first or second global bit line from high to low. In response to the voltage change of the global bit line, either the first or second write transistor is switched from on to off. Thereafter, the write control signal changes from high to low, allowing the voltage level of either the first or second local bit line to change from high to low by the first or second write transistor whichever is on. At about the timing when the write data appears on the first and second local bit lines, a word line control signal changes from low to high, allowing the data to be written into a memory cell according to the voltage levels of the first and second local bit lines.

[Read Operation]

The read operation of the semiconductor memory device of Patent Document 1 will be described. In the read operation, the word line control signal changes from low to high. This causes data to be read from a memory cell, changing the voltage level of either the first or second local bit line from high to low. Thereafter, the first and second transfer transistors are switched from off to on, allowing the voltage levels of the first and second local bit lines to be passed to the first and second global bit lines, respectively. When the potential difference between the first and second global bit lines reaches a given value, the sense amplifiers start up. In this way, data stored in the memory cell is read.

SUMMARY

In the semiconductor memory device of Patent Document 1, however, it is difficult to shorten the time from input of write data until completion of write of the data into a memory cell (write time). The reason is as follows. In the write operation, the first and second global bit lines are in the high-level precharged state until receiving write data. In this state, the first and second write transistors are on, allowing the first and second local bit lines to be equalized by the write control signal. Therefore, it is not allowed to change the write control signal from high to low until the voltage levels of the first and second global bit lines are fixed. For this reason, as the setup time of the write data (the time from input of the write data until fixing of the voltage levels of the first and second global bit lines) becomes longer, the timing of switching of the write control signal from high to low and the timing of switching of the word line control signal from low to high are delayed, resulting in increase in the cycle time of the write operation.

In addition, in the semiconductor memory device of Patent Document 1, it is difficult to shorten the time from the change of the word line control signal from low to high until the potential difference between the first and second global bit lines reaches a given value (read time). The reasons are as follows. First, in the read operation, changes in the voltage levels of the first and second local bit lines are passed to the first and second global bit lines through the first and second transfer transistors. It is therefore difficult to increase the change speed of the voltage levels of the first and second global bit lines that are driven by comparatively small-sized transistors of a memory cell. Secondly, in the read operation, the first and second global bit lines are in the high-level precharged state. Since the first and second write transistors are on in this state, the first and second local bit lines are connected to the line carrying the write control signal. Thus, with the load capacitance of the line carrying the write control signal added to the first and second local bit lines, it is difficult to increase the change speed of the voltage levels of the first and second local bit lines. Thirdly, since the gates of the write transistors in a plurality of banks are connected to the first and second global bit lines, the load capacitances of the first and second global bit lines are large. Therefore, it is difficult to increase the change speed of the voltage levels of the first and second global bit lines.

Moreover it is difficult to reduce the circuit area of the semiconductor memory device of Patent Document 1. The reason is as follow. Since the first and second transfer transistors are each made of a PMOS transistor, the voltage levels of the first and second global bit lines will never be lower than "VDD−Vthp" in the read operation, where "VDD" refers to the power supply voltage and "VDD−Vthp" refers to the gate voltage at the time when the transfer transistor (PMOS transistor) starts to become on. Therefore, sense amplifiers must be provided to amplify the potential difference between the first and second global bit lines, and this increases the circuit area of the semiconductor memory device.

Furthermore, it is difficult to reduce the power consumption of the semiconductor memory device of Patent Document 1. The reasons are as follow. First, in the read operation, when the voltage level of either the first or second local bit line drops to reach "VDD−Vthn" during the time from the change of the word line control signal from low to high until the voltage level of either the first or second global bit line changes from high to low, discharge will be started from this voltage-drop local bit line to the other local bit line (high-level local bit line). Discharge will further be started from the local bit line having the voltage level of "VDD−Vthn" through the first or second transfer transistor toward the line carrying the write control signal (high-level line). The voltage "Vthn" refers to the gate voltage at the time when an NMOS transistor starts to become on. Such discharge may decrease the voltage level of the high-level local bit line to the low level (i.e., data in the memory cell may be corrupted). Secondly, when the write control signal is high, a through current will occur between a drive transistor of the memory cell and a PMOS transistor for driving the write control signal to the high level. Such useless charge/discharge and through current will consume power.

It is an objective of the present disclosure to provide a semiconductor memory device capable of shortening the write time, shortening the read time, reducing the circuit area, and reducing power consumption.

According to one aspect of the present disclosure, the semiconductor memory device includes: a plurality of memory cells; a pair of first and second local bit lines to which the plurality of memory cells are connected; a pair of first and second write global bit lines; a pair of first and second read global bit lines; a first write transistor having a source connected to a power supply node to which a power supply voltage is supplied, a drain connected to the first local bit line, and a gate connected to the second write global bit line; a second write transistor having a source connected to the power supply node, a drain connected to the second local bit line, and a gate connected to the first write global bit line; a third write transistor having a source connected to the first write global bit line, a drain connected to the first local bit line, and a gate to which a first control signal is supplied; a fourth write transistor having a source connected to the second write global bit line, a drain connected to the second local bit line, and a gate to which the first control signal is supplied; a precharge circuit connected to the first and second local bit lines; a write driver configured to control the first and second write global bit lines; and a read circuit connected to the first and second local bit lines and the first and second read global bit lines.

According to another aspect of the present disclosure, the semiconductor memory device includes: a plurality of memory cells; a pair of first and second local bit lines to which the plurality of memory cells are connected; a pair of first and second write global bit lines; a pair of first and second read global bit lines; a first write transistor having a source connected to a power supply node to which a power supply voltage is supplied, a drain connected to the first local bit line, and a gate connected to the second write global bit line; a second write transistor having a source connected to the power supply node, a drain connected to the second local bit line, and a gate connected to the first write global bit line; a third write transistor having a source connected to the first write global bit line, a drain connected to the first local bit line, and a gate to which a first control signal is supplied; a fourth write transistor having a source connected to the second write global bit line, a drain connected to the second local bit line, and a gate to which the first control signal is supplied; a write driver configured to control the first and second write global bit lines and having a function of turning on or off the first and second write transistors simultaneously; and a read circuit connected to the first and second local bit lines and the first and second read global bit lines.

According to yet another aspect of the present disclosure, the semiconductor memory device includes: a plurality of memory cells; a pair of first and second local bit lines to which the plurality of memory cells are connected; a pair of first and second write global bit lines; a pair of first and second read global bit lines; a first write transistor having a source connected to a ground node to which a ground voltage is supplied, a drain connected to the first local bit line, and a gate connected to the second write global bit line; a second write transistor having a source connected to the ground node, a drain connected to the second local bit line, and a gate connected to the first write global bit line; a third write transistor having a source connected to the first write global bit line, a drain connected to the first local bit line, and a gate to which a first control signal is supplied; a fourth write transistor having a source connected to the second write global bit line, a drain connected to the second local bit line, and a gate to which the first control signal is supplied; a precharge circuit connected to the first and second local bit lines; a write driver configured to control the first and second write global bit lines; and a read circuit connected to the first and second local bit lines and the first and second read global bit lines.

DETAILED DESCRIPTION

Embodiments of the present disclosure will be described hereinafter with reference to the accompanying drawings that are presented for illustrating, not restricting, the present invention. Although the present disclosure is described hereinafter taking a static random access memory (SRAM) as an example, it is also applicable to other fields.

First Embodiment

Figure 1:
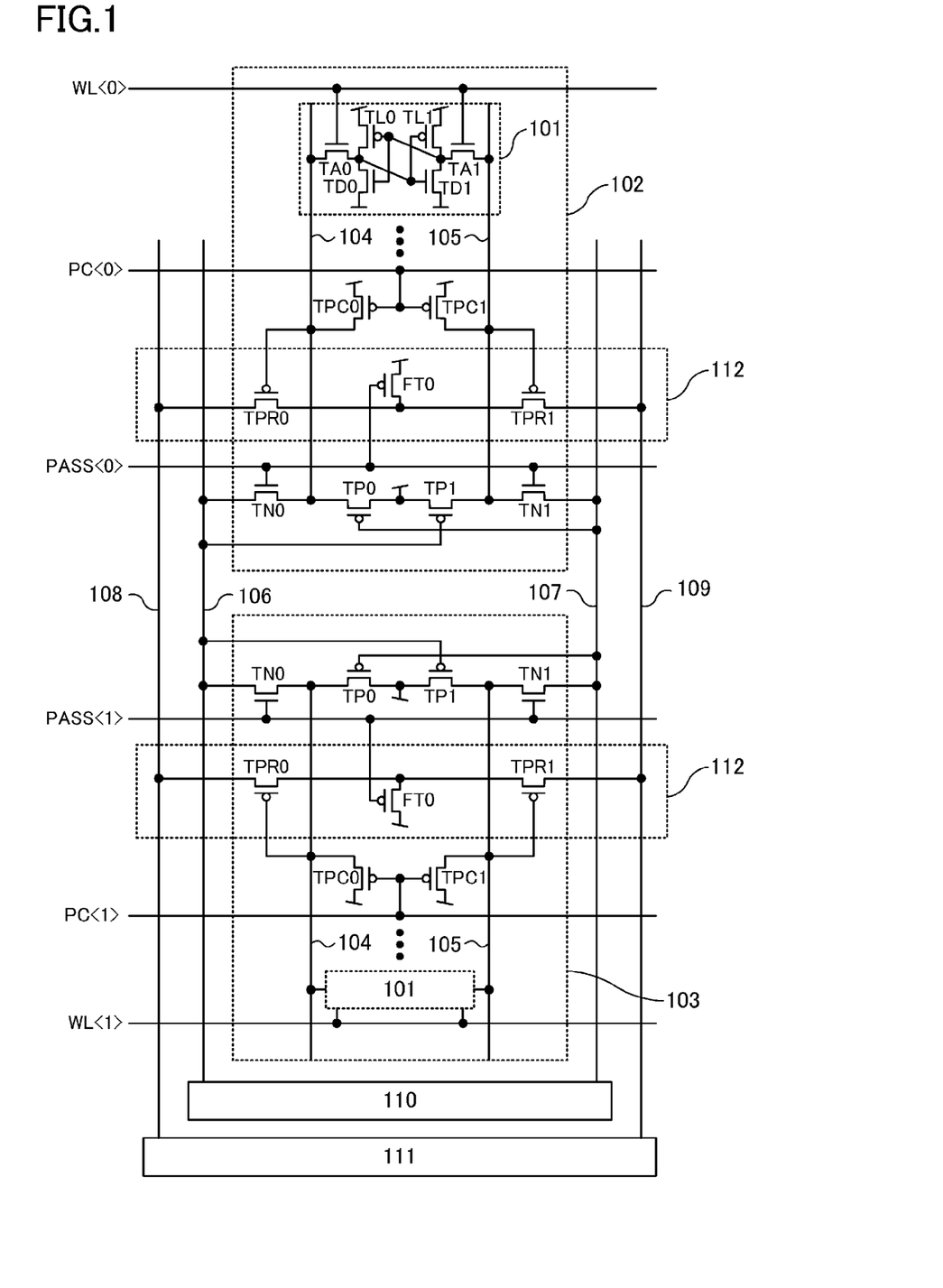
FIG. 1 is a view showing an example configuration of a semiconductor memory device of the first embodiment.

FIG. 1 shows an example configuration of a semiconductor memory device of the first embodiment. The semiconductor memory device includes a plurality of memory cells 101, a pair of local bit lines 104 and 105, a pair of write global bit lines 106 and 107, a pair of read global bit lines 108 and 109, write PMOS transistors TP0 and TP1, write NMOS transistors TN0 and TN1, precharge PMOS transistors TPC0 and TPC1 (precharge circuit), a write driver 110, a read driver 111, and a read circuit 112. The plurality of memory cells 101, the pair of local bit lines 104 and 105, the write PMOS transistors TP0 and TP1, the write NMOS transistors TN0 and TN1, the precharge PMOS transistors TPC0 and TPC1, and the read circuit 112 are included in each of blocks 102 and 103. The blocks 102 and 103 respectively receive precharge control signals PC<0> and PC<1> and write block selection signals PASS<0> and PASS<1>. The memory cells 101 in the blocks 102 and 103 respectively receive word line control signals WL<0> and WL<1>. Note that, in the following description, the precharge control signals PC<0> and PC<1> are collectively referred to as the "precharge control signal PC," the write block selection signals PASS<0> and PASS<1> are collectively referred to as the "write block selection signal PASS," and the word line control signals WL<0> and WL<1> are collectively referred to as the "word line control signal WL."

[Memory Cells]

Each of the plurality of memory cells 101 includes a pair of access transistors TA0 and TA1, a pair of drive transistors TD0 and TD1, and a pair of load transistors TL0 and TL1. The memory cells 101 are connected to the local bit lines 104 and 105.

[Write Transistors]

The write PMOS transistor TP0 (first write transistor) has a source connected to a power supply node (node to which the power supply voltage is supplied), a drain connected to the local bit line 104, and a gate connected to the write global bit line 107. The write PMOS transistor TP1 (second write transistor) has a source connected to the power supply node, a drain connected to the local bit line 105, and a gate connected to the write global bit line 106. The write NMOS transistor TN0 (third write transistor) has a source connected to the write global bit line 106, a drain connected to the local bit line 104, and a gate to which the block selection signal PASS is supplied. The write NMOS transistor TN1 (fourth write transistor) has a source connected to the write global bit line 107, a drain connected to the local bit line 105, and a gate to which the block selection signal PASS is supplied.

[Precharge Circuit]

The precharge PMOS transistor TPC0 has a source connected to the power supply node, a drain connected to the local bit line 104, and a gate to which the precharge control signal PC is supplied. The precharge PMOS transistor TPC1 has a source connected to the power supply node, a drain connected to the local bit line 105, and a gate to which the precharge control signal PC is supplied.

[Write Driver, Read Driver]

The write driver 110 controls the write global bit lines 106 and 107. The read driver 111 reads data based on the voltage levels of the read global bit lines 108 and 109.

[Read Circuit]

The read circuit 112 is connected to the local bit lines 104 and 105. The read circuit 112 includes a control PMOS transistor FT0 and read PMOS transistors TPR0 and TPR1, for example. The control PMOS transistor FT0 has a source connected to the power supply node, a drain connected to a power supply control node, and a gate to which the write block selection signal PASS is supplied. The read PMOS transistor TPR0 has a source connected to the power supply control node, a drain connected to the read global bit line 108, and a gate connected to the local bit line 104. The read PMOS transistor TPR1 has a source connected to the power supply control node, a drain connected to the read global bit line 109, and a gate connected to the local bit line 105.

[Operation]

Next, the operation of the semiconductor memory device of FIG. 1 will be described. The semiconductor memory device executes a precharge operation of precharging the local bit lines 104 and 105, a write operation of writing write data into the memory cell 101 after the precharge operation, and a read operation of reading data stored in the memory cell 101 after the precharge operation.

<Precharge Operation>

In the precharge operation, the word line control signal WL is set at the low level. This turns off the access transistors TA0 and TA1 in the memory cell 101, disconnecting a pair of memory nodes (a connecting node between the load transistor TL0 and the drive transistor TD0 and a connecting node between the load transistor TL1 and the drive transistor TD1) from the local bit lines 104 and 105, respectively.

The write block selection signal PASS is set at the low level. Thus turns off the write NMOS transistors TN0 and TN1, disconnecting the local bit lines 104 and 105 from the write global bit lines 106 and 107, respectively. In the read circuit 112, the control PMOS transistor FT0 is turned on.

The precharge control signal PC is set at the low level. This turns on the precharge PMOS transistors TPC0 and TPC1, to allow precharging of the local bit lines 104 and 105 to the high level. In addition, the write driver 110 sets the voltage levels of the write global bit lines 106 and 107 at the high level.

<Write Operation>

In the write operation, the precharge control signal PC is switched from low to high. This turns off the precharge PMOS transistors TPC0 and TPC1, disconnecting the local bit lines 104 and 105 from the power supply node (i.e., releasing the precharging of the local bit lines 104 and 105).

The word line control signal WL is switched from low to high. This turns on the access transistors TA0 and TA1 in the memory cell 101, connecting the memory nodes to the local bit lines 104 and 105.

The write block selection signal PASS is switched from low to high. This turns on the write NMOS transistors TN0 and TN1, connecting the local bit lines 104 and 105 to the write global bit lines 106 and 107, respectively. In the read circuit 112, the control PMOS transistor FT0 is switched from on to off.

The write driver 110 changes the voltage level of either the write global bit line 106 or 107 from high to low, while keeping the high voltage level of the other, according to write data supplied.

Assuming that the voltage level of the write global bit line 106 is changed from high to low, the voltage level of the local bit line 104 goes low since the write NMOS transistor TN0 is on. In contrast, since the voltage level of the write global bit line 107 is kept high and the write NMOS transistor TN1 is on, the voltage level of the local bit line 105 is high. In addition, with the change of the voltage level of the write global bit line 106 from high to low, the write PMOS transistor TP1 is switched from off to on. This connects the local bit line 105 to the power supply node, whereby the voltage level of the local bit line 105 is kept high. In this way, data is written into the memory cell 101.

In the read circuit 112, with the voltage level of the local bit line 104 going low, the read PMOS transistor TPR0 is turned on, connecting the read global bit line 108 to the power supply control node. However, since the control PMOS transistor FT0 is off, the power supply control node is not connected to the power supply node. This prevents the read global bit line 108 from being driven uselessly.

<Read Operation>

In the read operation, the precharge control signal PC is switched from low to high. This turns off the precharge PMOS transistors TPC0 and TPC1, disconnecting the local bit lines 104 and 105 from the power supply node.

The write block selection signal PASS is kept low. This keeps the write NMOS transistors TN0 and TN1 in the off state, whereby the local bit lines 104 and 105 are kept disconnected from the write global bit lines 106 and 107, respectively. In the read circuit 112, the control PMOS transistor FT0 is kept in the on state. In other words, the sources of the read PMOS transistors TPR0 and TPR1 are connected to the power supply node.

The word line control signal WL is switched from low to high. This turns on the access transistors TA0 and TA1, connecting the memory nodes to the local bit lines 104 and 105. According to the data stored in the memory cell 101, the voltage level of either the local bit line 104 or 105 changes from high to low while that of the other is kept high.

Assuming that the voltage level of the local bit line 105 has changed from high to low, the read PMOS transistor TPR1 is switched from off to on in the read circuit 112, connecting the read global bit line 109 to the power supply control node. Thus, the read PMOS transistor TPR1 drives the read global bit line 109, changing the voltage level of the read global bit line 109 to the high level. The read driver 111 reads the data stored in the memory cell 101 based on the change in the voltage levels of the read global bit lines 108 and 109.

As described above, in the semiconductor memory device of FIG. 1, in the write operation, the write block selection signal PASS may be changed from low to high before the voltage levels of the write global bit lines 106 and 107 are fixed. This can shorten the write time (from input of write data until completion of write into the memory cell 101).

Also, in the write operation, the local bit line 104 (or 105) is connected to the power supply node through the one-stage write PMOS transistor TP0 (or TP1). Therefore, the capability of holding the voltage level of the local bit line 104 (or 105) at the high level (write capability) is high, and this facilitates the writing into the memory cell 101, compared with the case that the local bit line 104 (or 105) is connected to the power supply node through a plurality of stages of transistors (e.g., the semiconductor memory device in Patent Document 1). It is therefore possible to reduce the transistor size of the write PMOS transistors TP0 and TP1 (i.e., reduce the circuit area of the semiconductor memory device) while securing the write capability. Alternatively, it is possible to reduce the operating lower-limit voltage while securing the write capability.

Moreover, since the gates of the write PMOS transistors TP0 and TP1 are not connected to the read global bit lines 108 and 109, the load capacitance of the read global bit lines 108 and 109 can be reduced. This can increase the change speed of the voltage levels of the read global bit lines 108 and 109, and as a result, shorten the read time (from the change of the word line control signal from low to high until read of data stored in the memory cell 101 by the read driver 111).

In the read operation, since the write NMOS transistors TN0 and TN1 are off, the local bit lines 104 and 105 are disconnected from the write global bit lines 106 and 107, respectively. Thus, with no useless load capacitance (load capacitance of the write global bit lines 106 and 107) being added to the local bit lines 104 and 105, the change speed of the voltage levels of the local bit lines 104 and 105 can be increased, and as a result, the read time can be shortened.

Moreover, in the read operation, the write NMOS transistors TN0 and TN1 are off, and the local bit line 104 is disconnected from the local bit line 105. Therefore, when the voltage level of either the local bit line 104 or 105 decreases to reach "VDD−Vthn," no useless charge/discharge or through current will occur, unlike the semiconductor memory device in Patent Document 1. This can reduce power consumption, and also prevent data corruption in the memory cell, achieving stable operation.

In the read operation, the read global bit line 108 (or 109) is driven by the read PMOS transistor TPR0 (or TPR1). Therefore, the change speed of the voltage levels of the read global bit lines 108 and 109 can be increased, compared with the semiconductor memory device in Patent Document 1 (where the global bit lines are driven by comparatively small-sized transistors in the memory cell). As a result, the read time can be shortened. Also, it is unnecessary to provide sense amplifiers because the drive capability of the read global bit lines is high.

Furthermore, unlike the semiconductor memory device in Patent Document 1, it is neither necessary to charge/discharge local bit lines that are not the target of write nor to control a through current and a charge/discharge current with a write control signal in the read operation. This can reduce the circuit area of the semiconductor memory device. Also, since the local bit lines 104 and 105 can be shortened, the load capacitance and the inter-line coupling capacitance of the local bit lines 104 and 105 can be reduced. As a result, the write time and the read time can be shortened.

Note that, although the sources of the read PMOS transistors TPR0 and TPR1 are connected to the power supply node through the control PMOS transistor FT0 in the semiconductor memory device of FIG. 1, they may be directly connected to the power supply node without the interposition of the control PMOS transistor FT0.

Second Embodiment

Figure 2:
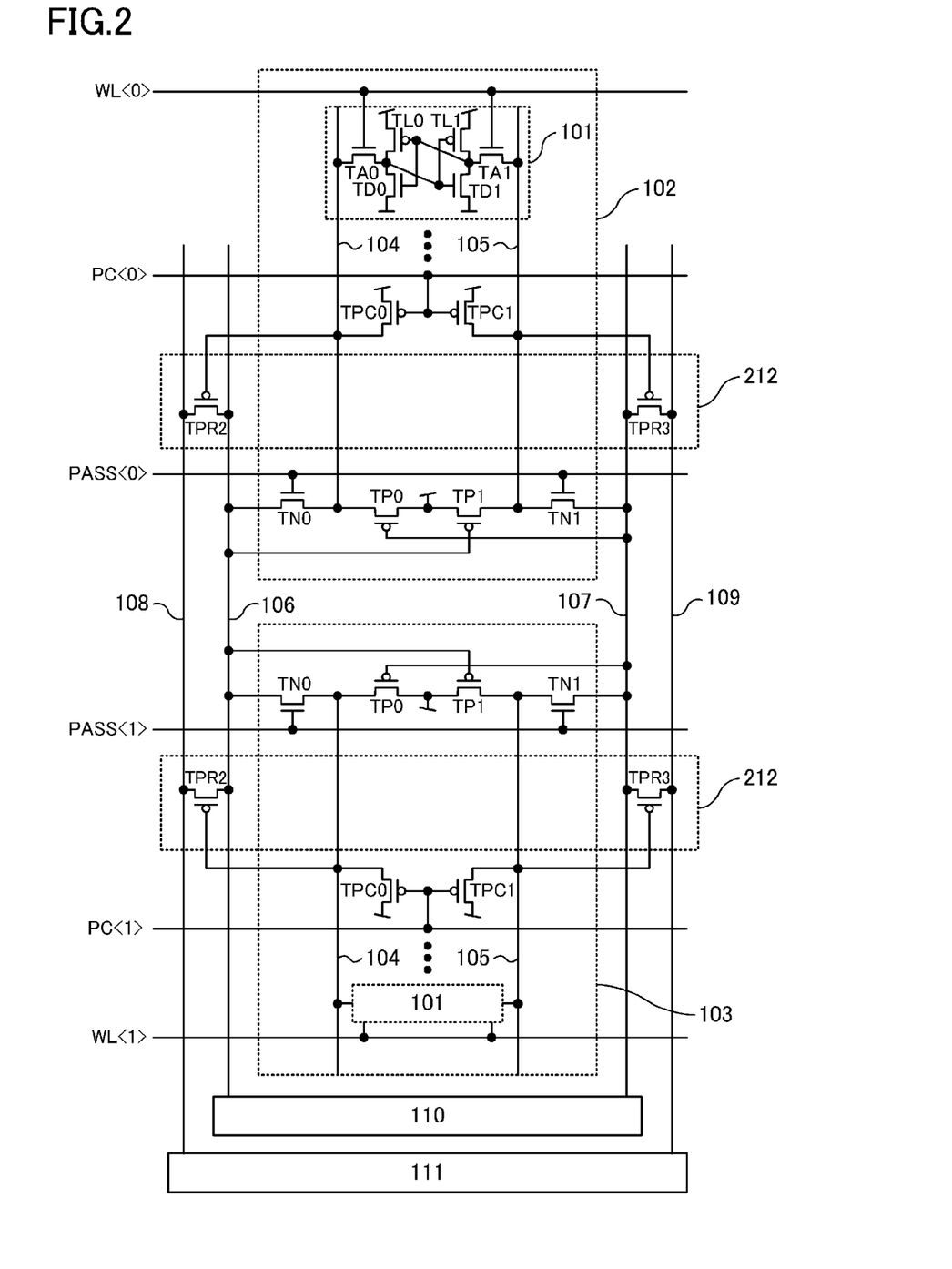
FIG. 2 is a view showing an example configuration of a semiconductor memory device of the second embodiment.

FIG. 2 shows an example configuration of a semiconductor memory device of the second embodiment. The semiconductor memory device includes a read circuit 212 in place of the read circuit 112 shown in FIG. 1. The other components are the same as those of the semiconductor memory device of FIG. 1.

[Read Circuit]

The read circuit 212 includes read PMOS transistors TPR2 and TPR3. The read PMOS transistor TPR2 has a source connected to the write global bit line 106, a drain connected to the read global bit line 108, and a gate connected to the local bit line 104. The read PMOS transistor TPR3 has a source connected to the write global bit line 107, a drain connected to the read global bit line 109, and a gate connected to the local bit line 105.

[Operation]

The operations (precharge operation, write operation, and read operation) of the semiconductor memory device of FIG. 2 will be described.

<Precharge Operation>

In the precharge operation, as in the semiconductor memory device of FIG. 1, the word line control signal WL, the write block selection signal PASS, and the precharge control signal PC are set at the low level, and the write driver 110 sets the voltage levels of the write global bit lines 106 and 107 at the high level.

In the read circuit 212, with the local bit lines 104 and 105 being precharged to the high level, the read PMOS transistors TPR2 and TPR3 are off. This disconnects the read global bit lines 108 and 109 from the write global bit lines 106 and 107, respectively.

<Write Operation>

In the write operation, as in the semiconductor memory device of FIG. 1, the precharge control signal PC, the word line control signal WL, and the write block selection signal PASS are switched from low to high. The write driver 110 changes the voltage level of either the write global bit line 106 or 107 from high to low, while keeping the high voltage level of the other, according to the supplied write data.

Assuming that the voltage level of the write global bit line 106 is changed from high to low, the voltage level of the local bit line 104 goes low because the write NMOS transistor TN0 is on. In the read circuit 212, with the voltage level of the local bit line 104 going low, the read PMOS transistor TPR2 becomes on, thereby connecting the read global bit line 108 to the write global bit line 106. However, since the voltage level of the write global bit line 106 is low, the read global bit line 108 is not driven uselessly.

<Read Operation>

In the read operation, as in the semiconductor memory device of FIG. 1, the precharge control signal PC and the word line control signal WL are switched from low to high, and the write block selection signal PASS is kept low. Thus, according to the data stored in the memory cell 101, the voltage level of either the local bit line 104 or 105 changes from high to low while that of the other is kept high.

Assuming that the voltage level of the local bit line 105 has changed from high to low, the read PMOS transistor TPR3 is switched from off to on in the read circuit 212, whereby the read global bit line 109 is driven by the read PMOS transistor TPR3, changing the voltage level of the read global bit line 109 to the high level.

As described above, the semiconductor memory device of FIG. 2 does not require the control PMOS transistor FT0, permitting reduction of the circuit area compared with the semiconductor memory device of FIG. 1. Also, since the load capacitance of the line carrying the write block selection signal PASS can be reduced, the change speed of the write block selection signal PASS can be increased, and as a result, the write time can be shortened. It is also possible to reduce the circuit area of the driver (not shown) that supplies the write block selection signal PASS while securing the change speed of the write block selection signal PASS.

Moreover, in the read operation, the read PMOS transistors TPR2 and TPR3 respectively use the write global bit lines 106 and 107 in their high-level states as the drive source. Therefore, the circuit area of the semiconductor memory device can be reduced compared with the case of using a line other than the write global bit lines 106 and 107 as the drive source for the read PMOS transistors TPR2 and TPR3.

The sources of the read PMOS transistors TPR2 and TPR3 are connected to the write driver 110 through the write global bit lines 106 and 107, respectively. Therefore, the peak current flowing to the source control lines for the read PMOS transistors TPR2 and TPR3 can be reduced, compared with the case of connecting the sources of the read PMOS transistors TPR2 and TPR3 to local amplifiers arranged in the word line direction. Thus, the circuit area of the source control driver (i.e., the write driver 110) for the read PMOS transistors TPR2 and TPR3 can be reduced, and as a result, the circuit area of the semiconductor memory device can be reduced.

In the read operation, the read time may be shortened by raising the voltage of the write global bit lines 106 and 107. Alternatively, the change speed of the voltage levels of the read global bit lines 108 and 109 may be increased using the coupling effect in the following manner: the write driver 110 is placed at a position opposite to the output direction of the bit lines, so that the direction in which the voltage level of the write global bit lines 106 and 107 changes from low to high is made the same as the direction in which the voltage level of the read global bit lines 108 and 109 changes from low to high. In this case, for increasing the coupling capacitance, it is effective to lay out the write global bit lines 106 and 107 to be adjacent to the local bit lines 104 and 105 or the read global bit lines 108 and 109.

Third Embodiment

Figure 3:
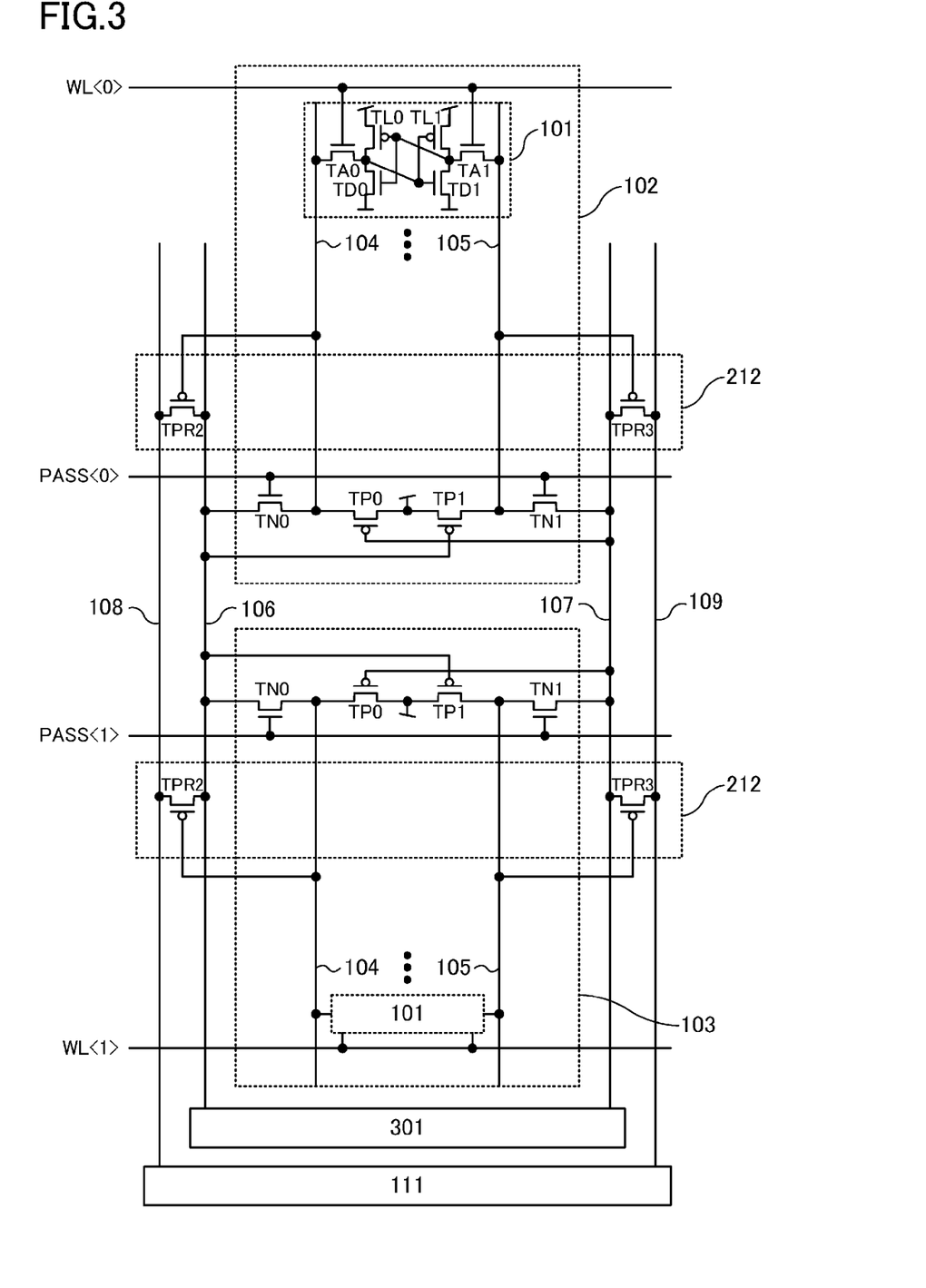
FIG. 3 is a view showing an example configuration of a semiconductor memory device of the third embodiment.

FIG. 3 shows an example configuration of a semiconductor memory device of the third embodiment. The semiconductor memory device includes a write driver 301 in place of the precharge PMOS transistors TPC0 and TPC1 and the write driver 110 shown in FIG. 2. The other components are the same as those of the semiconductor memory device of FIG. 2.

[Operation]

The operations (precharge operation, write operation, and read operation) of the semiconductor memory device of FIG. 3 will be described.

<Precharge Operation>

In the precharge operation, as in the semiconductor memory device of FIG. 2, the word line control signal WL and the write block selection signal PASS are set at the low level. This disconnects the local bit lines 104 and 105 from the write global bit lines 106 and 107, respectively.

The write driver 301 sets the voltage levels of the write global bit lines 106 and 107 at the low level. This turns on the write PMOS transistors TP0 and TP1, allowing the local bit lines 104 and 105 to be connected to the power supply node and as a result precharged to the high level.

<Write Operation>

In the write operation, as in the semiconductor memory device of FIG. 2, the word line control signal WL and the write block selection signal PASS are switched from low to high. This turns on the write NMOS transistors TN0 and TN1, allowing the local bit lines 104 and 105 to be connected to the write global bit lines 106 and 107, respectively.

The write driver 301 changes the voltage level of either the write global bit line 106 or 107 from low to high while keeping the low voltage level of the other, according to the write data.

Assuming that the voltage level of the write global bit line 107 is changed from low to high, the voltage level of the local bit line 105 goes high because the write NMOS transistor TN1 is on. In contrast, since the voltage level of the write global bit line 106 is kept low and the write NMOS transistor TN0 is on, the voltage level of the local bit line 104 goes low. Also, with the voltage level of the write global bit line 106 being kept low, the write PMOS transistor TP1 is kept in the on state. Thus, the local bit line 105 is connected to the power supply node, allowing its voltage level to be kept high.

When the voltage level of the local bit line 104 goes low, the read PMOS transistor TPR2 becomes on in the read circuit 212, thereby allowing the read global bit line 108 to be connected to the write global bit line 106. However, since the voltage level of the write global bit line 106 is low, the read global bit line 108 is not driven uselessly.

<Read Operation>

In the read operation, the write driver 301 switches the voltage levels of the write global bit lines 106 and 107 from low to high. This switches the write PMOS transistors TP0 and TP1 from on to off, disconnecting the local bit lines 104 and 105 from the power supply node. The precharging of the local bit lines 104 and 105 is thus released.

As in the semiconductor memory device of FIG. 2, the word line control signal WL is switched from low to high, and the write block selection signal PASS is kept low. Thus, according to the data stored in the memory cell 101, the voltage level of either the local bit line 104 or 105 changes from high to low while that of the other is kept high.

Assuming that the voltage level of the local bit line 105 has changed from high to low, the read PMOS transistor TPR3 is switched from off to on in the read circuit 212, whereby the read global bit line 109 is driven by read PMOS transistor TPR3, changing the voltage level of the read global bit line 109 to the high level. The read driver 111 reads the data stored in the memory cell 101 based on the change in the read global bit lines 108 and 109.

As described above, the semiconductor memory device of FIG. 3 does not require the precharge circuit (the precharge PMOS transistors TPC0 and TPC1), and thus can reduce the circuit area compared with the semiconductor memory device of FIG. 2. Also, with the area reduction, the local bit lines 104 and 105 or the read global bit lines 108 and 109 can be shortened. This can reduce the load capacitance of the local bit lines 104 and 105 or the read global bit lines 108 and 109, and thus the read time can be shortened.

In the precharge operation, the local bit line 104 (or 105) is connected to the power supply node through the one-stage write PMOS transistor TP0 (or TP1). Therefore, the precharge capability (capability of raising the voltage level of the local bit line 104 (or 105) to the high level) can be enhanced, compared with the case of connecting the local bit line 104 (or 105) to the power supply node through a plurality of stages of transistors (e.g., the semiconductor memory device in Patent Document 1). As a result, the cycle time of the precharge operation can be shortened. Also, it is possible to reduce the transistor size of the write PMOS transistors TP0 and TP1 while securing the precharge capability.

Note that the semiconductor memory device of FIG. 3 may further include precharge PMOS transistors TPC0 and TPC1 (precharge circuit) to assist the precharge operation. In this case, the precharge PMOS transistors TPC0 and TPC1 may be smaller in transistor size than those shown in FIG. 1.

[Example Configuration of Write Driver]

Figure 4:
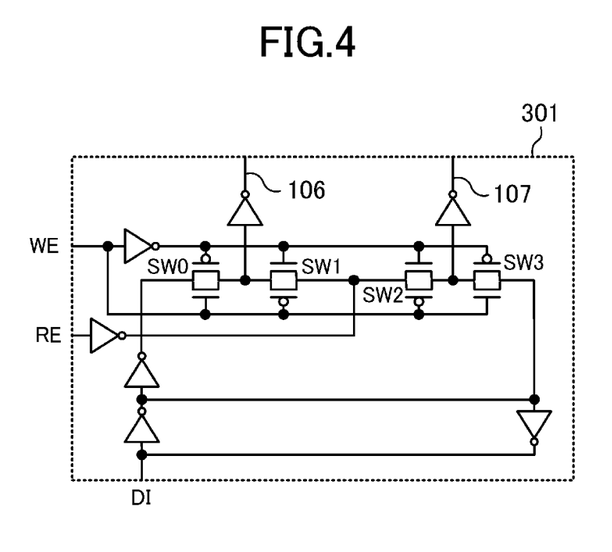
FIG. 4 is a view showing an example configuration of a write driver in FIG. 3.

FIG. 4 shows an example configuration of the write driver 301, which includes a plurality of inverters and switches SW0 to SW3.

<Precharge Operation>

In the precharge operation, a write enable signal WE is set at the low level, whereby the switches SW0 and SW3 are turned off while the switches SW1 and SW2 are turned on. A read enable signal RE is set at the low level, whereby the voltage levels of the sources of the switches SW1 and SW2 go high, and thus the voltage levels of the write global bit lines 106 and 107 go low.

<Write Operation>

In the write operation, the write enable signal WE is set at the high level, whereby the switches SW1 and SW2 are turned off while the switches SW0 and SW3 are turned on. Write data DI is supplied to the sources of the switches SW0 and SW3 through inverters, and the voltage levels of the write global bit lines 106 and 107 are set according to the write data DI. For example, when the write data DI is "1 (high level)," the voltage level of the source of the switch SW0 is high, and the voltage level of the write global bit line 106 is low. In contrast, the voltage level of the source of the switch SW3 is low, and the voltage level of the write global bit line 107 is high.

<Read Operation>

In the read operation, the write enable signal WE is set at the low level, whereby the switches SW0 and SW3 are turned off while the switches SW1 and SW2 are turned on. The read enable signal RE is set at the high level, whereby the voltage levels of the sources of the switches SW1 and SW2 go low, and thus the voltage levels of the write global bit lines 106 and 107 go high.

(Alteration of Memory Cells)

Figure 5:
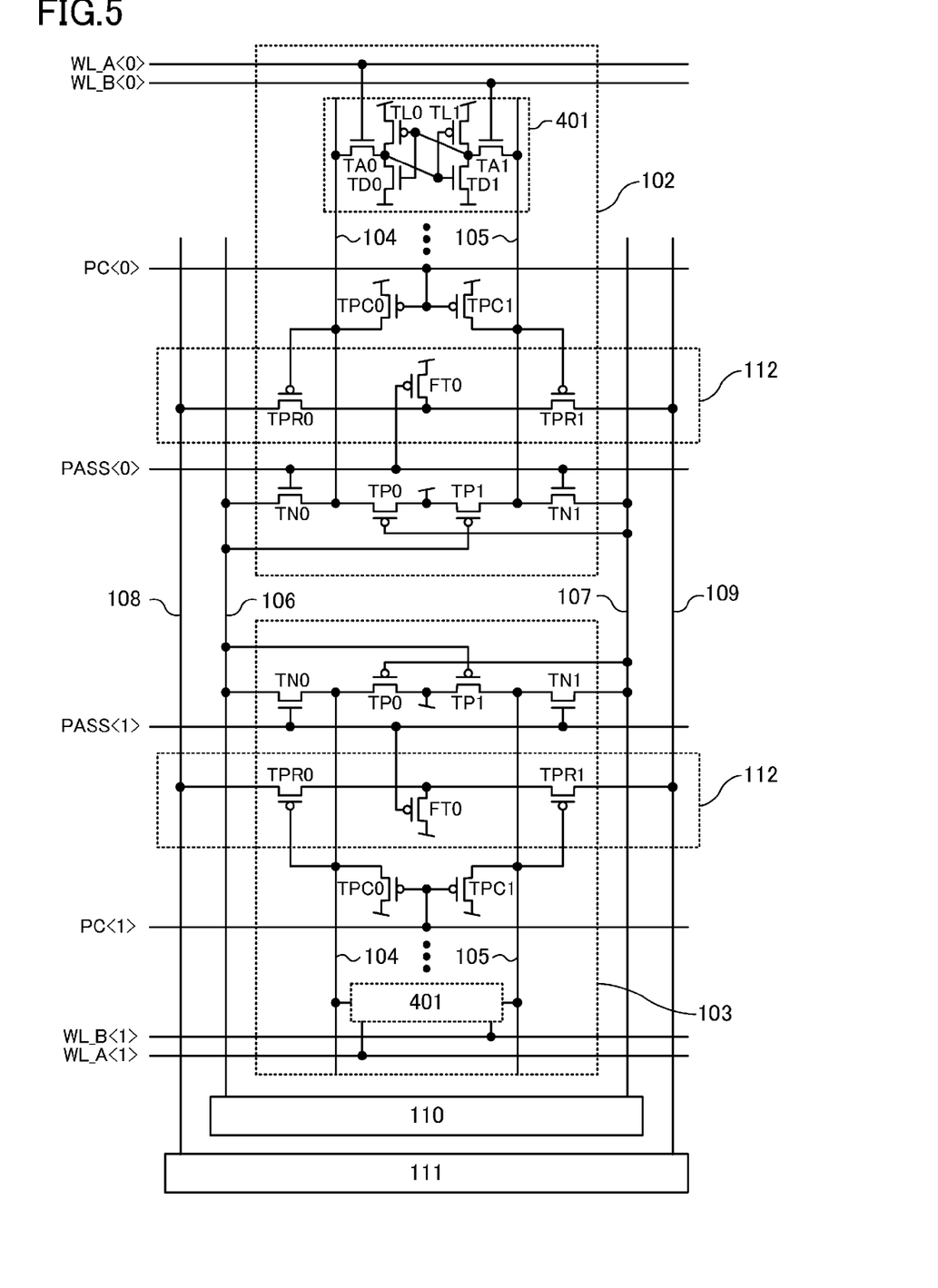
FIG. 5 is a view showing an alteration of memory cells.

The semiconductor memory devices of FIGS. 1-3 may include memory cells 401 shown in FIG. 5 (two-port-read memory cells) in place of the memory cells 101. In each memory cell 401, a word line control signal (WL_A<0> or WL_A<1>) is supplied to the gate of the access transistor TA0, and a word line control signal (WL_B<0> or WL_B<1>) is supplied to the gate of the access transistor TA1.

In a semiconductor memory device involving no selection by columns, input/output circuits must be placed so as not to protrude from the width of one memory cell. Therefore, for a memory cell as shown in FIG. 5, it is necessary to place two sets of input/output circuits within the width of one memory cell. This increases the circuit area of the input/output circuits, and as a result, increases the circuit area of the semiconductor memory device. In particular, when a sense amplifier is provided for each port as in the semiconductor memory device of Patent Document 1, the circuit area of the semiconductor memory device will drastically increase. In contrast, in the semiconductor memory devices of FIGS. 1-3, which require no sense amplifiers, increase in the circuit area of the semiconductor memory device can be suppressed or reduced even when the memory cells 101 are replaced with the memory cells 401 shown in FIG. 5. Also, since the bit line length can be shortened, the read time can be shortened.

Figure 7:
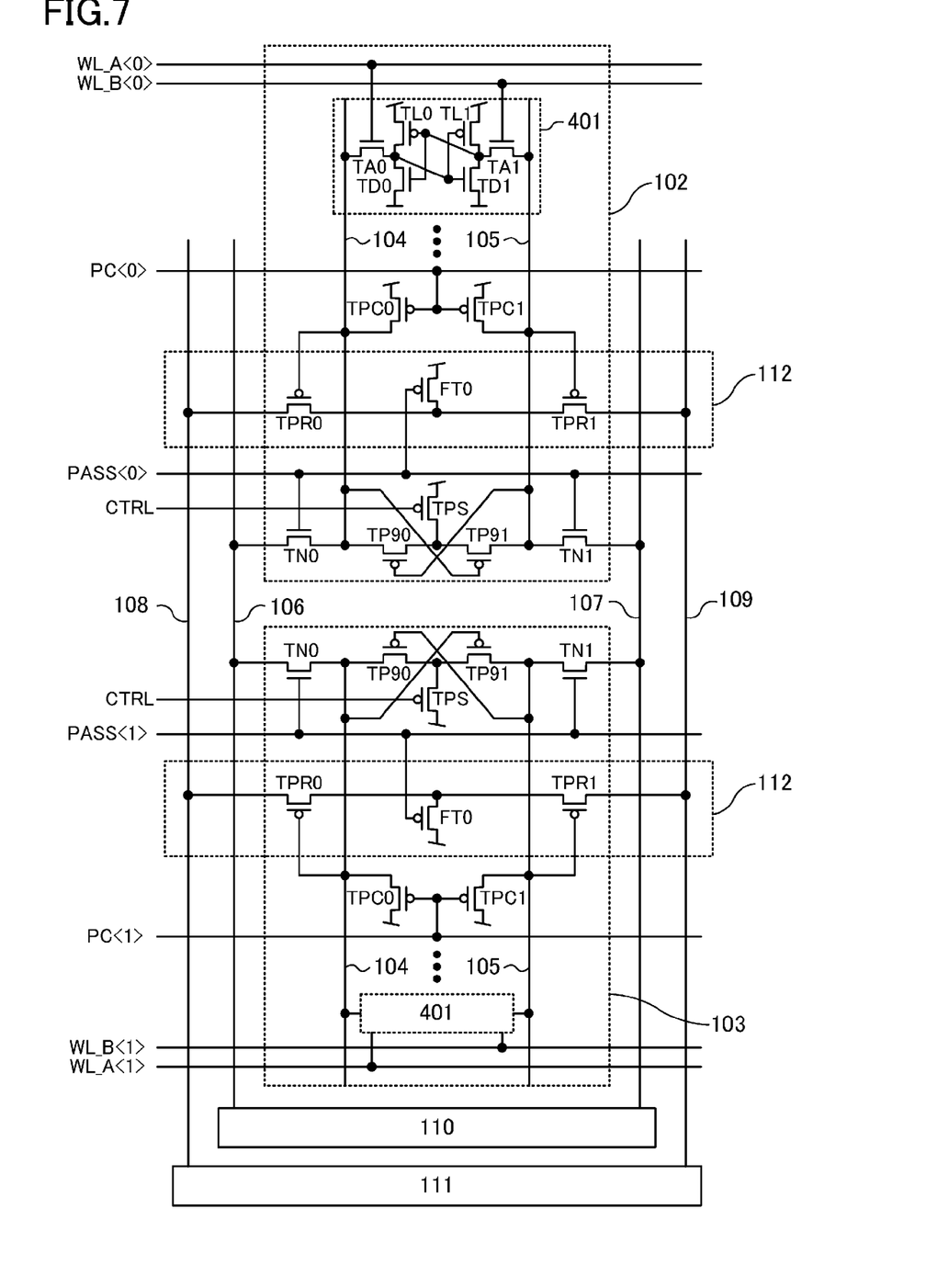
FIG. 7 is a view showing a comparative example of the semiconductor memory device of FIG. 5.

As shown in FIG. 7, write PMOS transistors TP90 and TP91 may be provided in place of the write PMOS transistors TP0 and TP1 shown in FIG. 5. The gate of the write PMOS transistor TP90 is connected to the local bit line 105, and the gate of the write PMOS transistor TP91 is connected to the local bit line 104. The drain of the write PMOS transistor TP90 is connected to the local bit line 104, and the drain of the write PMOS transistor TP91 is connected to the local bit line 105. Further, in the semiconductor memory device of FIG. 7, which includes the two-port-read memory cells 401, the voltage levels of both the local bit lines 104 and 105 go low in some cases. In consideration of this, in order to disconnect the drains of the write PMOS transistors TP90 and TP91 from the power supply node during the read operation, a PMOS transistor TPS (disconnecting circuit) is provided between the drains of the write PMOS transistors TP90 and TP91 and the power supply node. The PMOS transistor TPS is switched on/off by a control signal CTRL. Thus, in the semiconductor memory device of FIG. 7, which requires the disconnecting circuit, reduction of the circuit area is difficult. In contrast, in the semiconductor memory device of FIG. 5, since the voltage levels of the write global bit lines 106 and 107 are high during the read operation, both the write PMOS transistors TP0 and TP1 are off. Therefore, it is unnecessary to provide a disconnecting circuit that disconnects the drains of the PMOS transistors TP0 and TP1 from the power supply node during the read operation. The circuit area can therefore be made smaller than that in the semiconductor memory device of FIG. 7.

(Alteration of Write Transistors)

Figure 6:
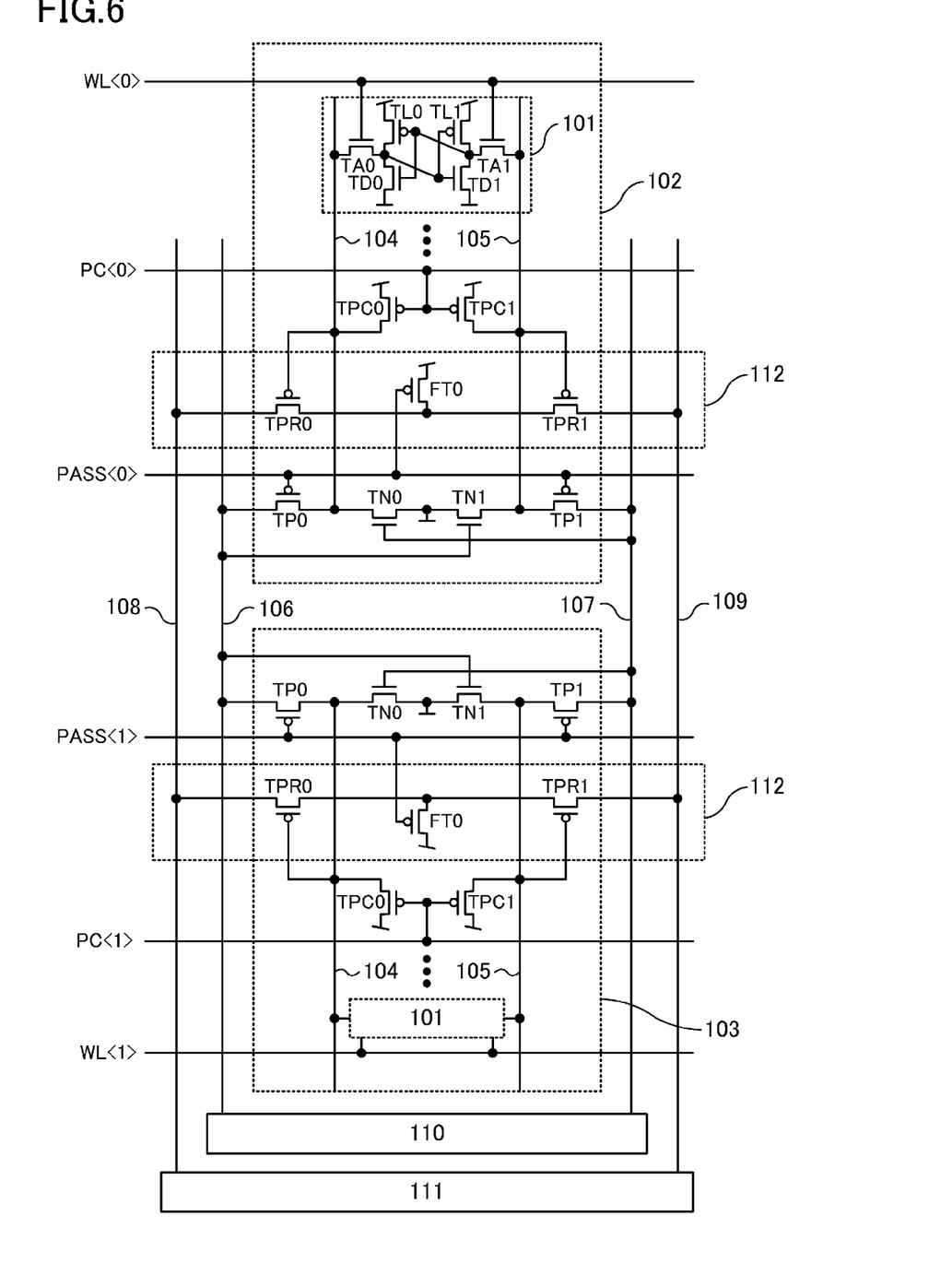
FIG. 6 is a view showing an alteration of write transistors.

In the semiconductor memory devices of FIGS. 1-3 and 5, the write PMOS transistors TP0 and TP1 may be interchanged with the write NMOS transistors TN0 and TN1 as shown in FIG. 6. In this case, the write NMOS transistor TN0 (first write transistor) has a source connected to a ground node (node to which the ground voltage is supplied), a drain connected to the local bit line 104, and a gate connected to the write global bit line 107. The write NMOS transistor TN1 (second write transistor) has a source connected to the ground node, a drain connected to the local bit line 105, and a gate connected to the write global bit line 106. The write PMOS transistor TP0 (third write transistor) has a source connected to the write global bit line 106, a drain connected to the local bit line 104, and a gate to which the block selection signal PASS is supplied. The write PMOS transistor TP1 (fourth write transistor) has a source connected to the write global bit line 107, a drain connected to the local bit line 105, and a gate to which the block selection signal PASS is supplied.

With the placement of the write PMOS transistors TP0 and TP1 and the write NMOS transistors TN0 and TN1 as shown in FIG. 6, the write block selection signal PASS and the write global bit lines 106 and 107 are controlled so that their voltage levels are opposite to those in the case of FIG. 1. For example, they are controlled as follows. In the precharge operation, the write block selection signal PASS is set at the high level, and the write driver 110 sets the write global bit lines 106 and 107 at the low level. In the write operation, the write block selection signal PASS is switched from high to low, and the write driver 110 changes either the write global bit line 106 or 107 from low to high, while keeping the low level of the other, according to write data. In the read operation, the write block selection signal PASS is kept high.

As described above, in the semiconductor memory device of FIG. 6, as in the semiconductor memory device of FIG. 1, in the write operation, the write block selection signal PASS may be changed from high to low before the voltage levels of the write global bit lines 106 and 107 are fixed. This can shorten the write time.

Also, in the write operation, the local bit line 104 (or 105) is connected to the ground node through the one-stage write NMOS transistor TN0 (or TN1). Therefore, the capability of holding the voltage level of the local bit line 104 (or 105) at the low level (write capability) is high, and this facilitates the writing into the memory cell 101, compared with the case that the local bit line 104 (or 105) is connected to the ground node through a plurality of stages of transistors. It is therefore possible to reduce the transistor size of the write NMOS transistors TN0 and TN1 (i.e., reduce the circuit area of the semiconductor memory device) while securing the write capability. Alternatively, it is possible to reduce the operating lower-limit voltage while securing the write capability.

Moreover, since the gates of the write NMOS transistors TN0 and TN1 are not connected to the read global bit lines 108 and 109, the load capacitance of the read global bit lines 108 and 109 can be reduced, and thus the read time can be shortened.

In the read operation, since the write PMOS transistors TP0 and TP1 are off, the local bit lines 104 and 105 are disconnected from the write global bit lines 106 and 107, respectively. Thus, with no useless load capacitance (load capacitance of the write global bit lines 106 and 107) added to the local bit lines 104 and 105, the read time can be shortened.

Moreover, in the read operation, since the voltage levels of the write global bit lines 106 and 107 are low, the write NMOS transistors TN0 and TN1 are off, disconnecting the local bit line 104 from the local bit line 105. Therefore, no useless charge/discharge or through current will occur. This can reduce power consumption, and also prevent data corruption in the memory cell, achieving stable operation.

In the read operation, the read global bit line 108 (or 109) is driven by the read PMOS transistor TPR0 (or TPR1). Therefore, the change speed of the voltage levels of the read global bit lines 108 and 109 can be increased, compared with the case of the semiconductor memory device in Patent Document 1 (where the global bit lines are driven by comparatively small-sized transistors in the memory cell). As a result, the read time can be shortened. Also, it is unnecessary to provide sense amplifiers because the drive capability of the read global bit lines is high.

In the semiconductor memory device of FIG. 6, a power supply control circuit switched on/off in response to the write block selection signal PASS may be inserted between the sources of the write NMOS transistors TN0 and TN1 and the ground node. The power supply control circuit may be off when the write block selection signal PASS is high (e.g., in the precharge operation and the read operation) and on when the signal PASS is low (e.g., in the write operation). With this configuration, in the write operation, the local bit lines 104 and 105 are prevented from being charged/discharged uselessly in the non-selected blocks.

Thus, the semiconductor memory devices described above, which can perform high-speed read operation, small-area, low-power operation, and low-voltage operation, are useful as large-capacity semiconductor memory devices having a hierarchical bit line structure While the present disclosure has been described in terms of essentially preferred embodiments, it should be understood that such embodiments are not intended to restrict the scope of the present invention, applications thereof, or uses thereof.

What is claimed is:

1. A semiconductor memory device, comprising:
   a plurality of memory cells;
   a pair of first and second local bit lines to which the plurality of memory cells are connected;
   a pair of first and second write global bit lines;
   a pair of first and second read global bit lines;
   a first write transistor having a source connected to a power supply node to which a power supply voltage is supplied, a drain connected to the first local bit line, and a gate connected to the second write global bit line;
   a second write transistor having a source connected to the power supply node, a drain connected to the second local bit line, and a gate connected to the first write global bit line;
   a third write transistor having a source connected to the first write global bit line, a drain connected to the first local bit line, and a gate to which a first control signal is supplied;
   a fourth write transistor having a source connected to the second write global bit line, a drain connected to the second local bit line, and a gate to which the first control signal is supplied;
   a precharge circuit connected to the first and second local bit lines;
   a write driver configured to control the first and second write global bit lines; and
   a read circuit connected to the first and second local bit lines and the first and second read global bit lines.

2. The semiconductor memory device of claim 1, wherein the read circuit includes:
   a control transistor having a source connected to the power supply node, a drain connected to a power supply control node, and a gate to which the first control signal is supplied;
   a first read transistor having a source connected to the power supply control node, a drain connected to the first read global bit line, and a gate connected to the first local bit line; and
   a second read transistor having a source connected to the power supply control node, a drain connected to the second read global bit line, and a gate connected to the second local bit line.

3. The semiconductor memory device of claim 2, wherein the precharge circuit precharges the first and second local bit lines in a precharge operation and releases the precharging of the first and second local bit lines in a write operation and a read operation,
the first control signal is a signal for turning off the third and fourth write transistors and turning on the control transistor in the precharge operation and the read operation, and turning on the third and fourth write transistors and turning off the control transistor in the write operation, and the write driver sets the voltage levels of the first and second write global bit lines so that the first and second write transistors be off in the precharge operation and the read operation, and sets the voltage levels of the first and second write global bit lines according to write data so that either the first or second write transistor be on in the write operation.

4. The semiconductor memory device of claim 1, wherein the read circuit includes:
- a first read transistor having a source connected to the first write global bit line, a drain connected to the first read global bit line, and a gate connected to the first local bit line; and
- a second read transistor having a source connected to the second write global bit line, a drain connected to the second read global bit line, and a gate connected to the second local bit line.

5. The semiconductor memory device of claim 4, wherein the precharge circuit precharges the first and second local bit lines in a precharge operation and releases the precharging of the first and second local bit lines in a write operation and a read operation, the first control signal is a signal for turning off the third and fourth write transistors in the precharge operation and the read operation, and turning on the third and fourth write transistors in the write operation, and the write driver sets the voltage levels of the first and second write global bit lines so that the first and second write transistors be off in the precharge operation and the read operation, and sets the voltage levels of the first and second write global bit lines according to write data so that either the first or second write transistor be on in the write operation.

6. A semiconductor memory device, comprising:
a plurality of memory cells;
a pair of first and second local bit lines to which the plurality of memory cells are connected;
a pair of first and second write global bit lines;
a pair of first and second read global bit lines;
a first write transistor having a source connected to a power supply node to which a power supply voltage is supplied, a drain connected to the first local bit line, and a gate connected to the second write global bit line;
a second write transistor having a source connected to the power supply node, a drain connected to the second local bit line, and a gate connected to the first write global bit line;
a third write transistor having a source connected to the first write global bit line, a drain connected to the first local bit line, and a gate to which a first control signal is supplied;
a fourth write transistor having a source connected to the second write global bit line, a drain connected to the second local bit line, and a gate to which the first control signal is supplied;
a write driver configured to control the first and second write global bit lines and having a function of turning on or off the first and second write transistors simultaneously; and
a read circuit connected to the first and second local bit lines and the first and second read global bit lines.

7. The semiconductor memory device of claim 6, wherein the read circuit includes:
- a first read transistor having a source connected to the first write global bit line, a drain connected to the first read global bit line, and a gate connected to the first local bit line; and
- a second read transistor having a source connected to the second write global bit line, a drain connected to the second read global bit line, and a gate connected to the second local bit line.

8. The semiconductor memory device of claim 7, wherein the first control signal is a signal for turning off the third and fourth write transistors in the precharge operation and the read operation, and turning on the third and fourth write transistors in the write operation, and the write driver sets the voltage levels of the first and second write global bit lines so that the first and second write transistors be on in the precharge operation, sets the voltage levels of the first and second write global bit lines so that the first and second write transistors be off in the read operation, and sets the voltage levels of the first and second write global bit lines according to write data so that either the first or second write transistor be on in the write operation.

9. A semiconductor memory device, comprising:
a plurality of memory cells;
a pair of first and second local bit lines to which the plurality of memory cells are connected;
a pair of first and second write global bit lines;
a pair of first and second read global bit lines;
a first write transistor having a source connected to a ground node to which a ground voltage is supplied, a drain connected to the first local bit line, and a gate connected to the second write global bit line;
a second write transistor having a source connected to the ground node, a drain connected to the second local bit line, and a gate connected to the first write global bit line;
a third write transistor having a source connected to the first write global bit line, a drain connected to the first local bit line, and a gate to which a first control signal is supplied;
a fourth write transistor having a source connected to the second write global bit line, a drain connected to the second local bit line, and a gate to which the first control signal is supplied;
a precharge circuit connected to the first and second local bit lines;
a write driver configured to control the first and second write global bit lines; and
a read circuit connected to the first and second local bit lines and the first and second read global bit lines.

10. The semiconductor memory device of claim 9, wherein the read circuit includes:
- a control transistor having a source connected to the power supply node, a drain connected to a power supply control node, and a gate to which the first control signal is supplied;
- a first read transistor having a source connected to the power supply control node, a drain connected to the first read global bit line, and a gate connected to the first local bit line; and
- a second read transistor having a source connected to the power supply control node, a drain connected to the second read global bit line, and a gate connected to the second local bit line.

11. The semiconductor memory device of claim 1, wherein the memory cells are two-port-read memory cells.
12. The semiconductor memory device of claim 6, wherein the memory cells are two-port-read memory cells.
13. The semiconductor memory device of claim 9, wherein the memory cells are two-port-read memory cells.

* * * * *